US006783629B2

(12) United States Patent
Glukhoy (10) Patent No.: US 6,783,629 B2
(45) Date of Patent: Aug. 31, 2004

(54) PLASMA TREATMENT APPARATUS WITH IMPROVED UNIFORMITY OF TREATMENT AND METHOD FOR IMPROVING UNIFORMITY OF PLASMA TREATMENT

(76) Inventor: Yuri Glukhoy, 440 Arguello Blvd. #1, San Francisco, CA (US) 94118

( * ) Notice: Subject to any disclaimer, the term of this patent is extended or adjusted under 35 U.S.C. 154(b) by 0 days.

(21) Appl. No.: 10/096,500

(22) Filed: Mar. 11, 2002

(65) Prior Publication Data

US 2003/0168172 A1 Sep. 11, 2003

(51) Int. Cl.[7] ............................ H05H 1/00; C23C 16/00
(52) U.S. Cl. ............................ 156/345.43; 156/345.41; 118/723 E; 118/723 MW
(58) Field of Search ...................... 156/345.28, 345.47, 156/345.43, 345.41, 345.48; 118/723 E, 723 MW, 723 I, 723 AN; 438/710, 711, 714

(56) References Cited

U.S. PATENT DOCUMENTS

| | | | |
|---|---|---|---|
| 4,840,702 A | | 6/1989 | Schumacher |
| 4,948,458 A | | 8/1990 | Ogle |
| 4,986,890 A | * | 1/1991 | Setoyama et al. ..... 204/298.06 |
| 5,110,437 A | * | 5/1992 | Yamada et al. ........ 204/298.33 |
| 5,277,751 A | | 1/1994 | Ogle |
| 5,304,279 A | | 4/1994 | Coultas et al. |
| 5,759,280 A | | 6/1998 | Holland et al. |
| 5,855,970 A | * | 1/1999 | Inushima et al. ........... 427/579 |
| 6,158,384 A | * | 12/2000 | Ye et al. .................... 118/723 I |
| 6,211,622 B1 | * | 4/2001 | Ryoji et al. ............. 315/111.21 |
| 6,238,582 B1 | | 5/2001 | Williams et al. |
| 6,297,595 B1 | | 10/2001 | Stimson et al. |
| 6,311,638 B1 | * | 11/2001 | Ishii et al. .......... 118/723 MW |
| 6,319,355 B1 | | 11/2001 | Holland |

* cited by examiner

Primary Examiner—Parviz Hassanzadeh (57) ABSTRACT

A plasma treatment apparatus with improved uniformity of treatment consists of a sealed housing that can be evacuated for the supply of a working gas and that contains a group of plasma-excitation elements in the form of RF or MW antennas, which generate plasma in a confined space within the housing. The surface of the object, e.g., a semiconductor substrate, is treated by this plasma. Depending on the type of the working gas and parameters of the process, the treatment may consist of cleaning, etching, coating, activation, etc. A distinguishing feature of the invention consists in that the plasma-excitation RF or MW antennas are oscillated by means of an oscillation device so that the local non-uniformities of treatment are "smoothened". The RF and MW antennas can be interchangeable and can be oscillated from the same oscillation drive. In one embodiments of the invention, the MW antennas are provided with annular magnets that generate electron-cyclotron resonance conditions for increase in density of plasma generated in the sealed housing of the apparatus.

12 Claims, 8 Drawing Sheets

PLASMA TREATMENT APPARATUS WITH IMPROVED UNIFORMITY OF TREATMENT AND METHOD FOR IMPROVING UNIFORMITY OF PLASMA TREATMENT

FIELD OF THE INVENTION

The present invention relates to the field of plasma treatment, in particular to a method and apparatus for treating various surfaces with improved uniformity of treatment. The invention may find application in such operations as etching, activation, cleaning, deposition, etc., in particular for treating surfaces of substrates in the manufacture of semiconductor devices.

BACKGROUND OFF THE INVENTION

The problem of uniformity of surface treatment in the semiconductor manufacturing remains important and even becomes more aggravated with development of new generations of semiconductor manufacturing machines, in particular with the transfer to 300 mm diameter wafers. For example, if in the previous generation of semiconductor manufacturing machines 5 to 3% uniformity of plasma treatment was acceptable, the modern machines for wafers of 300 mm in diameter should guarantee non-uniformity of plasma treatment not exceeding 2%.

Many attempts have been made heretofore to solve the problem of process uniformity in plasma treatment. All these attempts can be roughly divided into methods and devices based on redistribution of plasma-excitation electromagnetic fields and methods and devices based on movements or oscillations of the objects during plasma treatment.

For example, U.S. Pat. No. 4,840,702 issued in 1989 to Schumacher, III; John E. discloses a typical apparatus and method for improved plasma treatment of circuit boards in a plasma-treating zone and in a gas resupply zone established in a working chamber. The apparatus is provided with an actuating mechanism for causing a relative movement between the circuit boards and the zones where the boards are treated. The apparatus preferably includes a chamber for receipt of a gas and has electrodes centrally positioned therein for generating an electrical field at a central portion of the chamber thereby exciting the gas there and creating a zone of intense plasma. A transport mechanism is provided in the chamber for moving the circuit boards alternately into and out of the central portion of the chamber for preselected periods of time thus alternately exposing the circuit boards to the intense plasma and to substantially fresh gas outside of the central portion of the chamber thereby providing more uniform plasma treatment of the surface areas of the circuit boards and improved cleaning and etching of openings through the circuit boards which receive a fresh supply of gas therein when the circuit boards are outside of the central portion of the chamber. Using appropriate electrodes, the same apparatus may be employed for deposition of metallic layers on the boards in a substantially continuous operation after plasma treatment.

The construction of the type described above was typically employed in conveyor-type systems, e.g., in systems for treating hard-drive disks in multiple-station conveyor type machines. Such plasma treatment devices are intended for use in specific machines and lack versatility required for modern stand-alone or cluster-type machines.

Known in the art are also ion-beam plasma treatment systems with rotation of the substrates with respect to the treatment beam. An example of such an apparatus is a device described in U.S. Pat. No. 6,238,582 issued on May 29, 2001 to K. Williams, et al. Although the apparatus of U.S. Pat. No. 6,238,582 relates to a reactive ion beam etching method, other than to the systems with anizotropic RF plasma, the principle used for achieving uniformity may serve as a typical example of an apparatus in which the uniformity is achieved by rotating the substrate with respect to the treating beam. More specifically, a process chamber of this apparatus includes a substrate holder that is pivotally mounted such that the angle of incidence of a collimated ion beam relative to a normal to the substrate surface may be adjusted in situ (i.e., during a process, without breaking vacuum). The substrate holder may be implemented for holding and rotating a single substrate, or for holding and moving two or more substrates in, for example, a planetary motion.

There are many other substrate treatment systems similar in principle, such as magnetron sputtering, ion-beam treatment, ion-beam sputtering, electron-beam sputtering, etc., where uniformity of treatment is achieved by rotating or otherwise moving the substrate with respect to the processing beam during treatment.

The second aforementioned method, which is less popular, is redistribution of electromagnetic plasma-excitation fields during treatment. A good example of such a system is the Endura system produced by Applied Materials, Inc. In this machine, which is described, e.g., in U.S. Pat. No. 6,297,595 issued on Oct. 2, 2001 to B. Stimson, improved uniformity is achieved by utilizing two 13.72 MHz RF antennas instead of one. Superposition of the electromagnetic plasma-excitation fields produces more uniform distribution of the resulting field in a space above the treated substrate.

Another approach to the solution of the uniformity treatment problem is to improve the design and parameters of the plasma-excitation coils or to use several coils.

For example, U.S. Pat. No. 4,948,458 issued to J. Ogle in 1990 discloses a multi-turn spiral coil for achieving improved uniformity. The spiral element, which is generally of the Archimedes type, extends radially and circumferentially between its interior and exterior terminals connected to the RF source via an impedance matching network. Coils of this general type produce oscillating RF fields having magnetic and capacitive field components that propagate through the dielectric window to heat electrons in the gas in a portion of the plasma in the chamber close to the window. The oscillating RF fields induce in the plasma currents that heat electrons in the plasma. The spatial distribution of the magnetic field in the plasma portion close to the window is a function of the sum of individual magnetic field components produced by each turn of the coil. The magnetic field component produced by each of the turns is a function of the magnitude of RF current in each turn, which differs for different turns because of transmission line effects of the coil at the frequency of the RF source.

For spiral designs as disclosed by and based on the Ogle '458 patent, the RF currents in the spiral coil are distributed to produce a torroidal shaped magnetic field region in the portion of the plasma close to the window, where power is absorbed by the gas to excite the gas to a plasma. At low pressures, in the 1.0 to 10 mTorr range, diffusion of the plasma from the ring shaped region produces plasma density peaks just above the workpiece in central and peripheral portions of the chamber, so the peak densities of the ions and electrons which process the workpiece are in proximity to the workpiece center line and workpiece periphery. At intermediate pressure ranges, in the 10 to 100-mTorr range, gas phase collisions of electrons, ions, and neutrons in the plasma prevent substantial diffusion of the plasma charged particles outside of the torroidal region. As a result, there is a relatively high plasma flux in a ring-like region of the workpiece but low plasma fluxes in the center and peripheral workpiece portions.

These differing operating conditions result in substantially large plasma flux (i.e., plasma density) variations between the ring and the volumes inside and outside of the ring, resulting in a substantial standard deviation, i.e., in excess of three, of the plasma flux incident on the workpiece. The substantial standard deviation of the plasma flux incident on the workpiece has a tendency to cause non-uniform workpiece processing, i.e., different portions of the workpiece are etched to different extents and/or have different amounts of molecules deposited on them.

Many coils have been designed to improve the uniformity of the plasma. U.S. Pat. No. 5,759,280, Holland et al., issued Jun. 2, 1998, discloses a coil, which, in the commercial embodiment, has a diameter of 12 inches and is operated in conjunction with a vacuum chamber having a 14.0-inch inner wall circular diameter. The coil applies magnetic and electric fields to the chamber interior via a quartz window having a 14.7-inch diameter and 0.8 inch uniform thickness. Circular semiconductor wafer workpieces are positioned on a workpiece holder about 4.7 inches below a bottom face of the window so the center of each workpiece is coincident with a centerline of the coil.

The coil of the '280 patent produces considerably smaller plasma flux variations across the workpiece than the coil of the '458 patent. The standard deviation of the plasma flux produced by the coil of the '280 patent on a 200 mm wafer in such a chamber operating at 5 milliTorr is about 2.0, a considerable improvement over the standard deviation of approximately 3.0 for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

Other arrangements directed to improving the uniformity of the plasma density incident on a workpiece have also concentrated on geometric principles, usually concerning coil geometry. See, e.g., U.S. Pat. Nos. 5,304,279, 5,277,751, etc.

The problems inherent in apparatuses where uniformity of plasma treatment is achieved due to improvement in the construction of the coil and distribution of the plasma-excitation field are partially solved by a y system described in U.S. Pat. No. 6,319,355 issued on Nov. 20, 2001 to J. Holland. The apparatus utilizes an RF processor for treating workpieces with an RF plasma in a vacuum chamber and includes a coil responsive to an RF source to produce magnetic and electric fields that excite ionizable gas in the chamber to a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Although the last-mentioned device results in a rather high uniformity of treatment, a disadvantage of this device, as well as all other known devices, systems and methods mentioned earlier, consists in that uniformity of plasma treatment can be adjusted or controlled in a narrow range of RF power. None of the known devices and methods possesses versatility required for achieving uniformity required for plasma treatment of modern 300 mm diameter wafers, or similar products.

In some applications, e.g., for high-speed and heavy-duty etching of silicon and silicon oxides in fluorocarbonaceous gases, the plasma should have a very high density of electrons, e.g., higher that $10^{12}$ cm$^{-3}$. None of the existing technologies described above is capable of satisfying this condition.

OBJECTS OF THE INVENTION

It is an object of the present invention to provide an apparatus and method for uniform plasma treatment of surfaces of objects in a working chamber due to oscillations of the plasma-excitation electromagnetic field with respect to the treated surface. It is another object is to provide the aforementioned apparatus and method in which uniformity of plasma treatment is achieved by combining oscillatory movements of the plasma-excitation electromagnetic field with a running wave in a microwave frequency range. Still another object is to provide the apparatus of the last-mentioned type, in which the dielectric waveguide for microwaves is simultaneously used for the supply of cooling air. Another object is to provide the aforementioned apparatus, which is simple in construction and inexpensive to manufacture. Another object is to provide a method for improving uniformity of plasma treatment in surface treatment of objects such as semiconductor substrates. It is another object to provide an apparatus suitable for generating high-density plasma required for high-speed and heavy-duty etching of silicon and silicon oxides in fluorocarbonaceous media.

SUMMARY OF THE INVENTION

A plasma treatment apparatus with improved uniformity of treatment consists of a sealed housing that can be evacuated for the supply of a working gas and that contains a group of plasma-excitation elements in the form of RF or MW antennas, which generate plasma in a confined space within the housing. The surface of the object, e.g., a semiconductor substrate, is treated by this plasma. Depending on the type of the working gas and parameters of the process, the treatment may consist of cleaning, etching, coating, activation, etc. A distinguishing feature of the invention consists in that the plasma-excitation RF or MW antennas are oscillated by means of an oscillation device so that the local non-uniformities of treatment are "smoothened". The RF and MW antennas can be interchangeable and can be oscillated from the same oscillation drive.

DETAILED DESCRIPTION OF THE INVENTION

Figure 1:
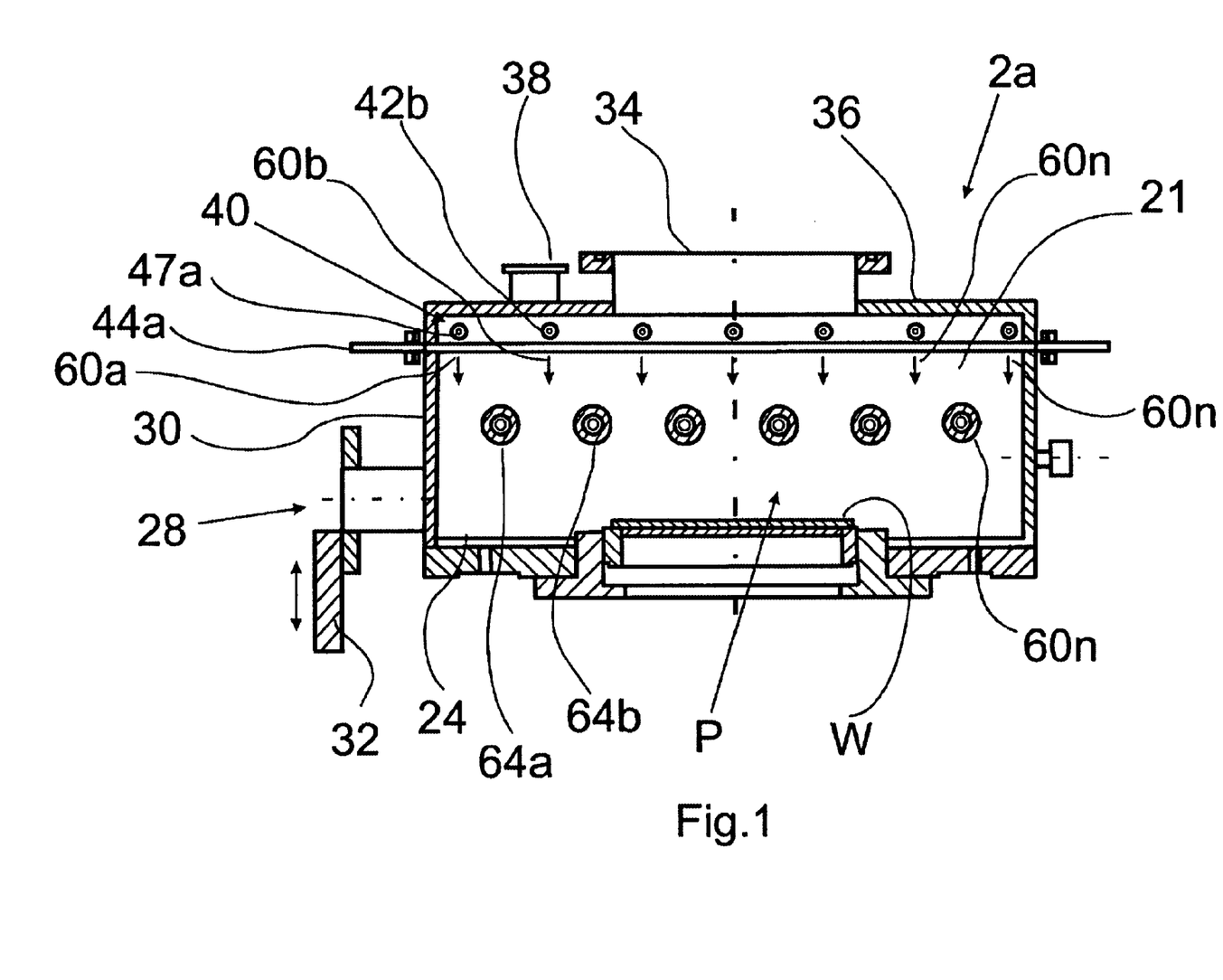
FIG. 1 is a schematic longitudinal sectional view of a plasma treatment apparatus of the invention.

FIG. 1 is a schematic longitudinal sectional view of a plasma treatment apparatus of the invention. The apparatus, which in general is designated by reference numeral 20, has a sealed housing 22, which, depending on the treatment process, can be made from a conductive or a non-conductive material, e.g., from stainless steel or ceramic. The interior of the housing 20 forms a working chamber 21. Located inside the housing, preferably near the bottom 24, is a substrate holder or chuck 26, which supports an object to be treated, e.g., a semiconductor wafer W. The wafer can be secured in the chuck 26, e.g., by vacuum or electrostatically. The housing 20 has a substrate loading port 28 formed in a side wall 30 of the housing 22. The loading port 28 is provided with a gate 32 that can close the port for treatment or open the port for loading and unloading of the substrates W.

An upper wall 36 may have observation windows 34 and 38 sealingly connected to the housing 20 and used for observation conditions in the working chamber and for insertion of measuring instruments.

A gas supply system 40, which is formed by rows of mutually perpendicular tubes 42a, 42b, . . . 42n and 44a, 44b, . . . 44n, passes through the working chamber 21 near the upper wall 36 of the housing 20. The gas supply system is more clearly shown in FIG. 2, which is a three-dimensional top view of the apparatus 20 of the invention. Reference numeral 48 in FIG. 2 designates a gas evacuation port connected to a vacuum pump (not shown) for inducing vacuum in the working chamber 21 prior to initiation of the treatment.

Figure 2:
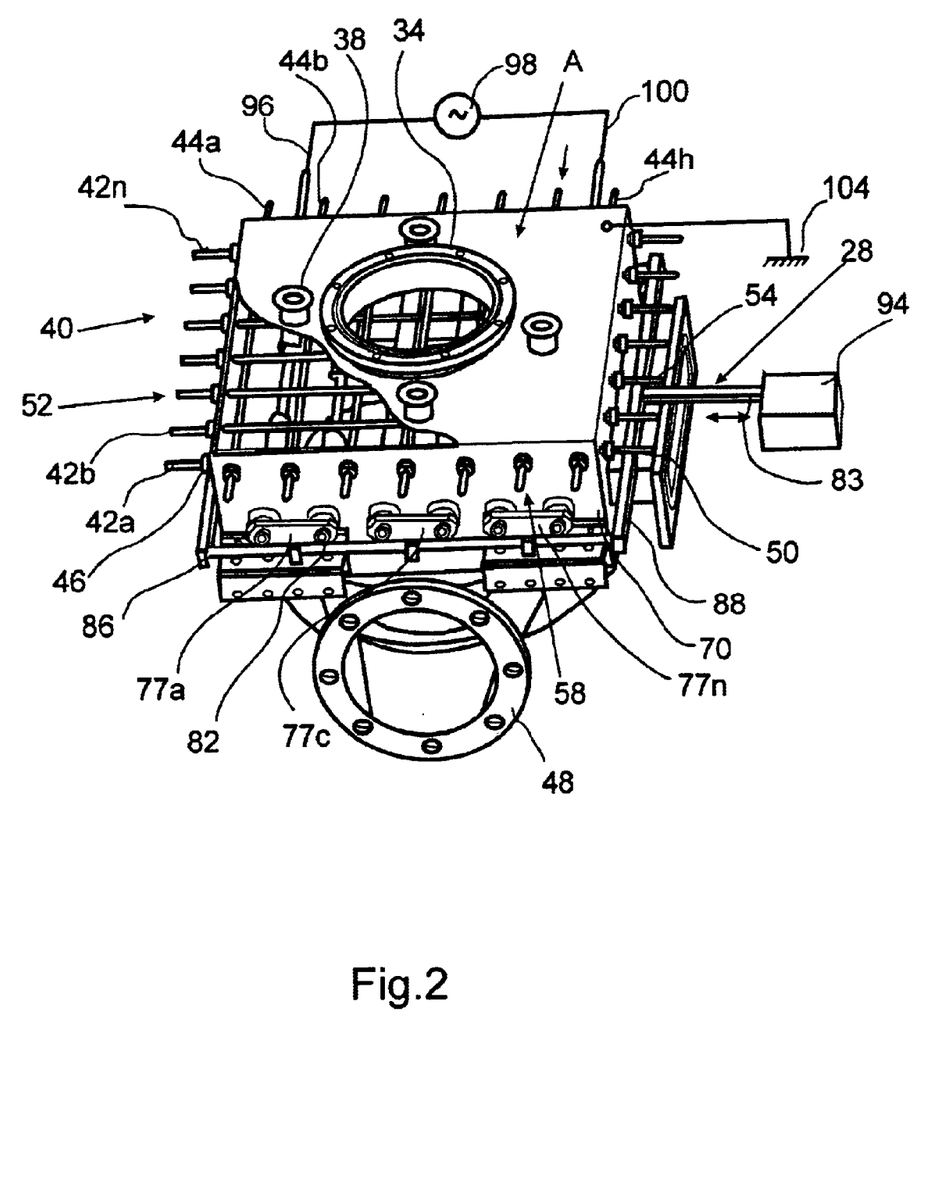
FIG. 2 is a three-dimensional top view of the apparatus of FIG. 1.

It can be seen from FIG. 2 that both ends of each tube extend outside the housing 22 via vacuum feedthrough devices. For example, one end of the tube 42a projects from the housing 22 via a vacuum feedthrough 46, while the opposite end of the tube 42a projects via a vacuum feedthrough 50. Description of other gas supply tubes an their respective feedthroughs is omitted since they are identical to those for the tube 42a. Vacuum feedthroughs 46 may be standard devices produced, e.g., by Huntington Mechanical Laboratories, Inc., California, USA. As shown in FIG. 2, the upper wall 36 of the housing is grounded at 104.

It is understood that the gas feeding system 40 is a throughput system with the supply of gas into the tubes 42a, 42b, . . . 42n through the gas inlet side 52 and with discharge of gas from these tubes through the gas outlet side 54 (FIG. 2). Similarly, the gas is supplied to the tubes 44a, 44b, . . . 44n through the second gas inlet side 56 and is discharged from these tubes through the second gas outlet side 58. It is understood that each gas input and output side is connected to a respective manifold (not shown).

Each tube has a plurality of outlet orifices for injecting working gas under pressure into the working chamber 21. The positions of these orifices are shown by arrows at 60a, 60b, . . . 60n (FIG. 1).

Figure 3:
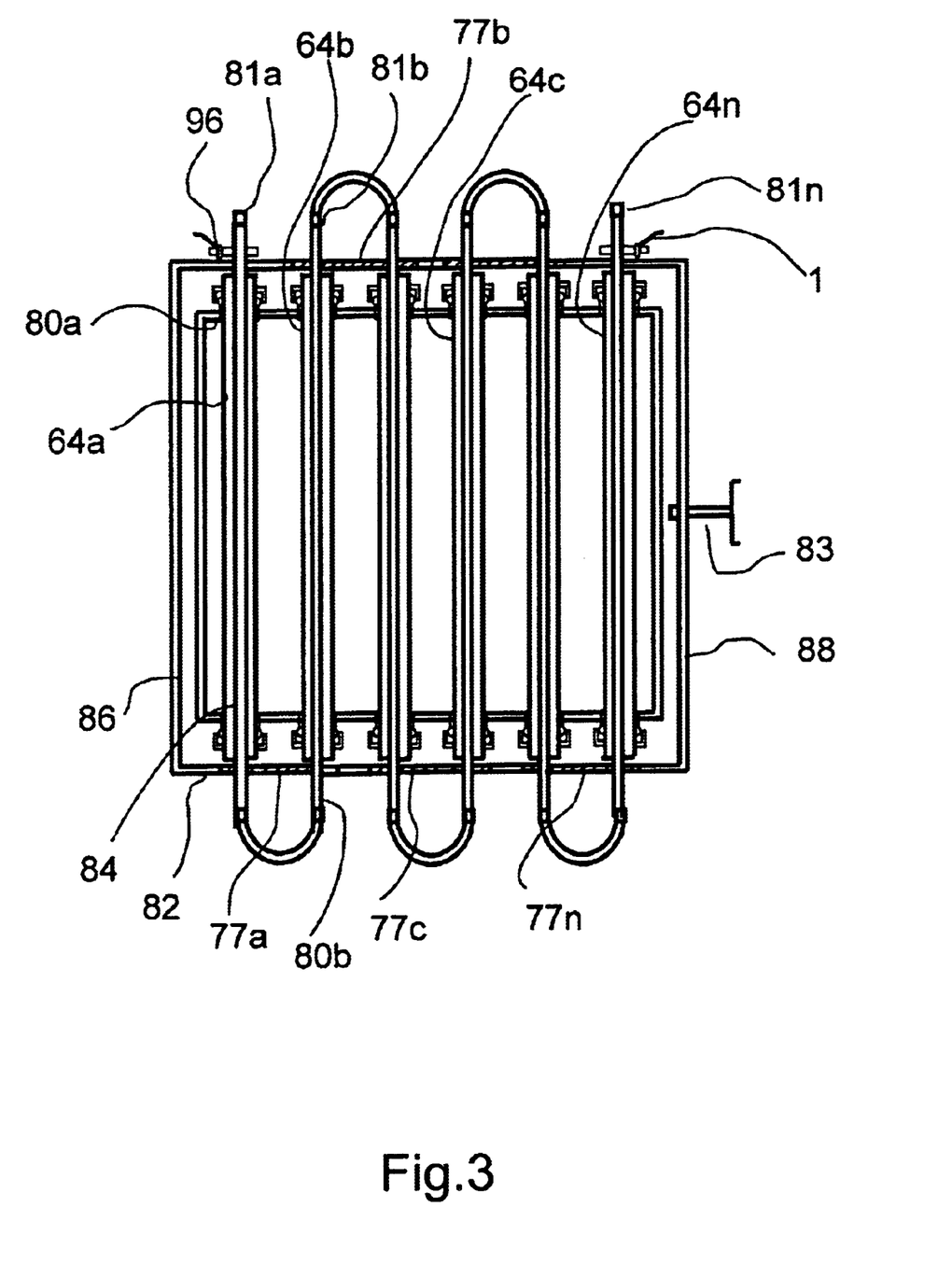
FIG. 3 is a top view on a part of the plasma-excitation unit in the direction of arrow A of FIG. 2 with the upper wall removed.

The main working unit of the apparatus 20 is a plasma-excitation unit 62 shown in more detail in FIGS. 1, 2. 3, where FIG. 3 is a top view on a part of the plasma-excitation unit in the direction of arrow A of FIG. 2 with the upper wall 36 (FIG. 1) removed. It can be seen from the above drawings, that the plasma-excitation unit 62 consists of a system of ceramic or quartz tubes 64a, 64b, . . . 64n which intersect the working chamber 21 in rows parallel, e.g., to tubes 44a, 44b, . . . 44n.

Figure 4:
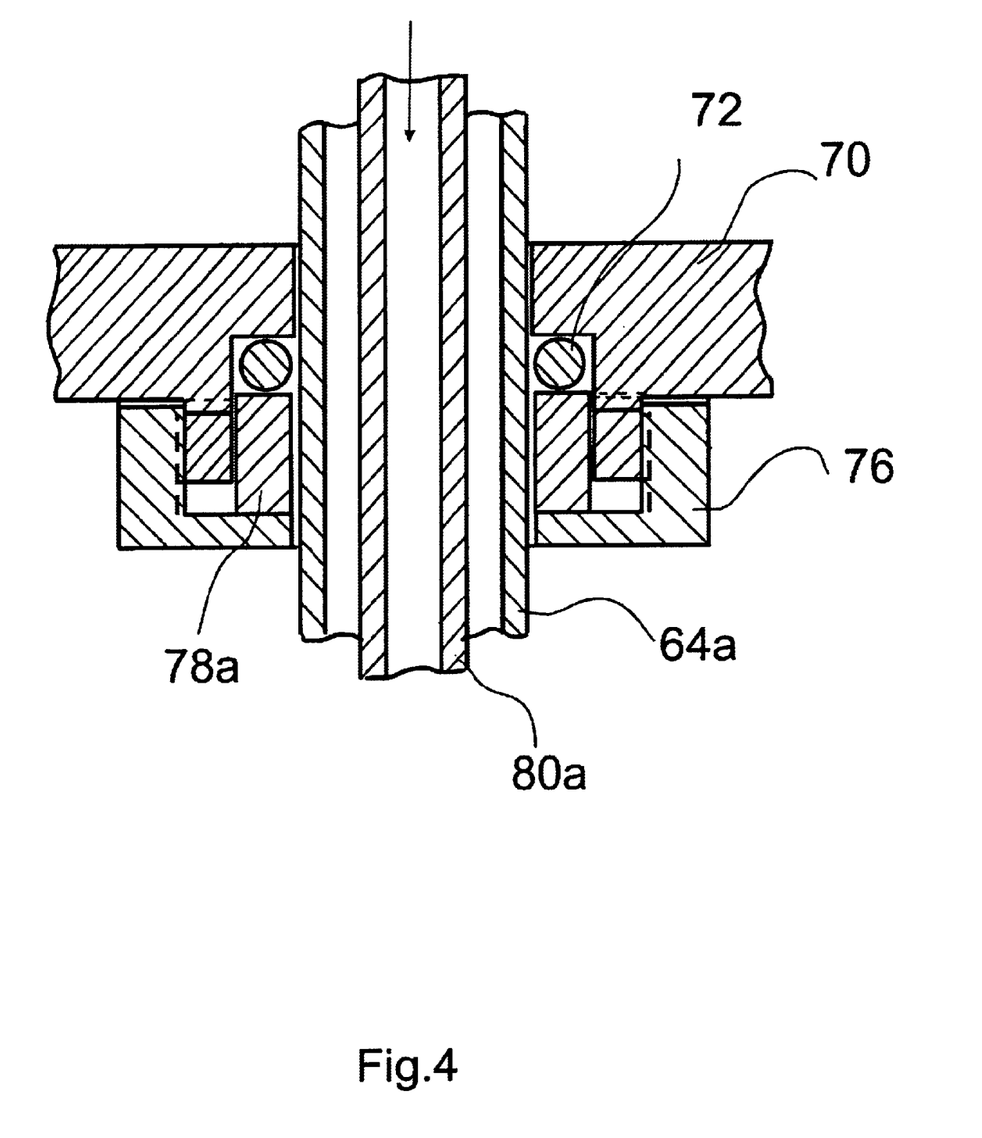
FIG. 4 a longitudinal sectional view of the vacuum feedthrough.

The ends of the tubes 64a, 64b, . . . 64n pass into the working chamber 21 via vacuum feedthroughs 66a, 66b, . . . 66n (FIG. 2). The construction of the vacuum feedthroughs 66a, 66b, . . . 66n is shown in FIG. 4, which is a longitudinal sectional view of the feedthrough. In this drawing, reference numeral 70 designates a side wall of the housing 22. A recess 72 may be formed in the side wall 70 for placing an O-ring 74. The ceramic or quartz tube 64a passes through the O-ring 74 with a tight fit. The O-ring is fixed in place by a nut 76 via a spacer 78. It is understood that similar feedthroughs are used on both side walls for insertion of all other tubes 64b 64n.

Inserted into the tubes 64a, 64b, . . . 64n are plasma-excitation or antenna tubes (hereinafter referred to as "tubes") 80a, 80b, . . . 80n, respectively, which are made from a material with high electrical conductivity. For example, tubes 80a, 80b, . . . 80n can be made of copper, or silver-coated copper, etc. The adjacent ends 81a, 81b, . . . 81n of the adjacent tubes, which project outside the housing 22, are interconnected, e.g., by flexible PVC tubes 82a, 82b, . . . to form a continuous path for a cooling water that may circulate through the interior of the tubes for cooling these tubes during the operation. The water cooling system, which may consist of a pump, valves, etc., is not shown. The water-cooling system may be of a circulation type or a throughput type. Furthermore, the aforementioned adjacent ends 81a, 81b, . . . 81n of the adjacent tubes on one side of the housing and the ends 85a, 85b, . . . 85n of the same tubes on the other side of the housing (FIG. 3) are also connected electrically by conductors 77a, 77b, . . . 77n and 79a, 79b, . . . 79n, respectively. In other words, all the plasma-generating tubes are connected in series in the form of a conductive spiral body.

As shown in FIG. 2, two opposite output ends of the spiral body formed by the conductive tubes 80a, 80b, . . . 80n and by their connecting conductors 77a, 77b, . . . 77n and 79a, 79b, . . . 79n are connected to respective terminals 96 and 100 of the power source 98 (FIG. 2). The RF power source 98 may generate power with oscillation frequency from several hundred kH to several hundred MHz. It is assumed that in the illustrated embodiment the frequency is 13.7 MHz.

As it has been mentioned above, the tubes 80a, 80b, . . . 80n and their connecting conductors 77a, 77b, . . . 77n and 79a, 79b, . . . 79n are electrically isolated from the housing 22 and from the oscillating frame 90.

In such a construction, the ceramic or quartz tubes 64a, 64b, . . . 64n intersect the working chamber 21 without violating its hermeticity, the interior of the tubes 80a, 80b, . . . 80n is sealed and is used for circulation of water, while the space 84 (FIG. 3) between the outer surface of the tubes 80a, 80b, . . . 80n and the inner surfaces of the ceramic or quartz tubes 64a, 64b, . . . 64n may remain not sealed from the atmosphere.

It should be noted that the inner tubes 80a, 80b, . . . 80n have a freedom of motions relative to the outer tubes 64a, 64b, . . . 64n within the limits of the inner space 84 of the outer tubes.

The aforementioned adjacent ends 81a, 81b, . . . 81n (FIG. 3) are rigidly interconnected by means of an actuation rod 82 on one side of the housing 22 and by means of an actuation rod 92 on the other side of the housing 22. However, the ends of the tubes 81a, 81b, . . . 81n are electrically isolated from the actuation rods 82 and 83. The ends of the rods 82 and 83 are interconnected by cross beams 86 and 88, so that the rods and the beams form a rigid frame 90. The cross beams 86 and 88 are connected via a rod 92 to an oscillator 94, which generates mechanical vibrations, e.g., on a frequency of from 50 to 5 kHz. An amplitude of oscillations of the frame 90, and hence of the inner tubes 80a, 80b, . . . 80n within the outer tubes 64a, 64b, . . . 64n must be smaller than the radial dimension of the space 84 between the tubes.

The system of the invention operates as follows:

The gate 32 is moved to open the loading port 28, the interior of the working chamber 21 is evacuated to clean the chamber of the residual products of the previous treatment, and a workpiece W is inserted into the chamber 21 via the port 28 and is places into and fixed in the chuck 26 electrostatically or by vacuum. The loading port 28 is closed by the gate 32, and the interior of the working chamber 21 is evacuated to a predetermined level of vacuum, e.g., to 10 mTorr. Vacuum is maintained during the entire working cycle. Working gas, e.g., argon, oxygen, $SF_6$, $NF_3$, $N_2$, $CF_4$, or mixtures of the gases, is supplied into the working chamber 21 from the gas inlet side 52 via the tubes 42a, 42b, . . . 42n and from second gas inlet side 56 via the tubes 44a, 44b, . . . 44n. The gas is pumped out from the working chamber through the gas outlet side 54 and the gas outlet side 58 (FIG. 2). The working pressure is maintained constant, e.g., at the level of 10 mTorr. At the same time, cooling water begins to flow through the tubes 80a, 80b, . . . 80n.

The plasma-excitation unit 62 is energized by switching on the RF power source 98. As a result, a RF power is generated by the tubes 80a, 80b, . . . 80n, which induce an RF electromagnetic field in the working chamber 21. In interaction with molecules of the working gas, the RF field generates a gaseous plasma P in the working chamber 21. This plasma P interacts with the surface of the wafer W and, depending on the type of the working gas, performs a surface treating operation such as cleaning, etching, coating, etc.

As has been mentioned earlier, the tubes 80a, 80b, . . . 80n, which induce an RF electromagnetic field in the working chamber 21, oscillate within the quartz or ceramic tubes 64a, 64b, . . . 64n with the frequency of the oscillator 94. If the tubes 80a, 80b, . . . 80n were stationary, then, as in a conventional plasma treatment apparatus, variations of the oscillation amplitude (expressed in terms of concentration of electrons in the plasma) across the wafer W will have a nature shown in the graph of FIG. 5. In this graph, the circles shown by broken lines show positions of the plasma-excitation, or antenna tubes 80a, 80b, . . . 80n. The right-side ordinate axis h (cm) corresponds to the distance from the treated surface of the wafer W to the level of amplitude curves α, β, γ. These curves can be obtained by computer simulation. The left-side ordinate $n^-(1/cm^3)$ corresponds to concentration of electrons in a unit of volume. It can be seen that the closer the substrate W to the excitation source, i.e., to the tubes 80a, 80b, . . . 80n, the greater the amplitudes, i.e., the concentration of electrons, and the higher the intensity of treatment and thus the shorter the treatment time. However, the greater the amplitude and the intensity of treatment, the greater the non-uniformity of treatment expressed by higher peaks on the curves. Thus, the curve γ that may correspond to the most desirable efficiency of treatment may have unacceptable level of treatment uniformity. It is understood that the resulting amplitude will be expressed by an averaged-amplitude line (not shown) parallel to the axis X.

Figure 5:
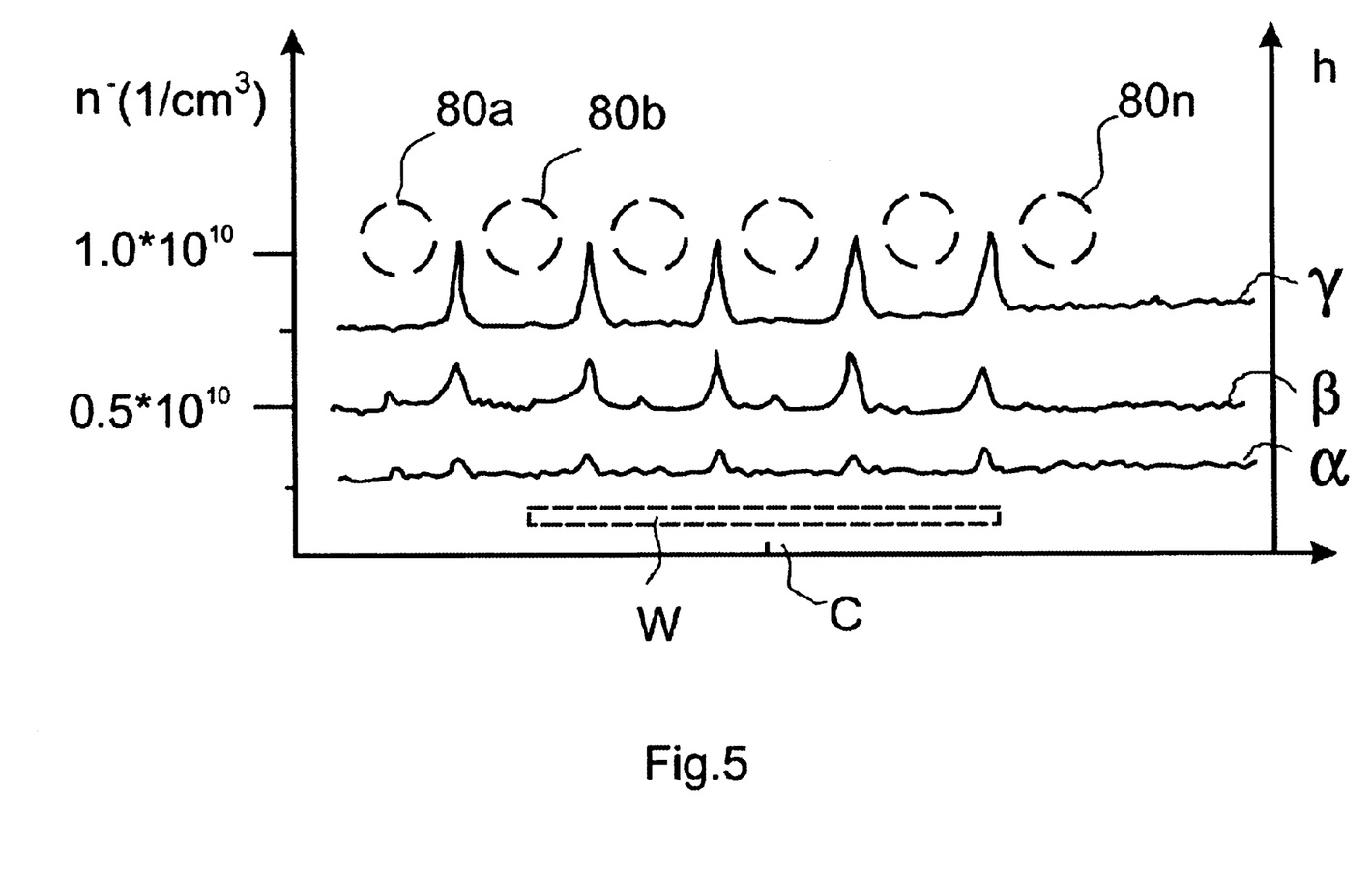
FIG. 5 is a graph that illustrates variations of the oscillation amplitude (expressed in terms of concentration of electrons in the plasma) across the substrate.

The system of the present invention overcomes this problem and provides very high uniformity of plasma treatment on the surface of substrate W in combination with high efficiency of treatment corresponding to the level of curve γ. This is achieved by "smoothening" the peaks of curve γ due to low-frequency oscillations of the antenna tubes and hence of the plasma-excitation RF power. Such smoothening of the amplitude peaks averages the peaks and thus makes the surface more uniformly treated.

Figure 6:
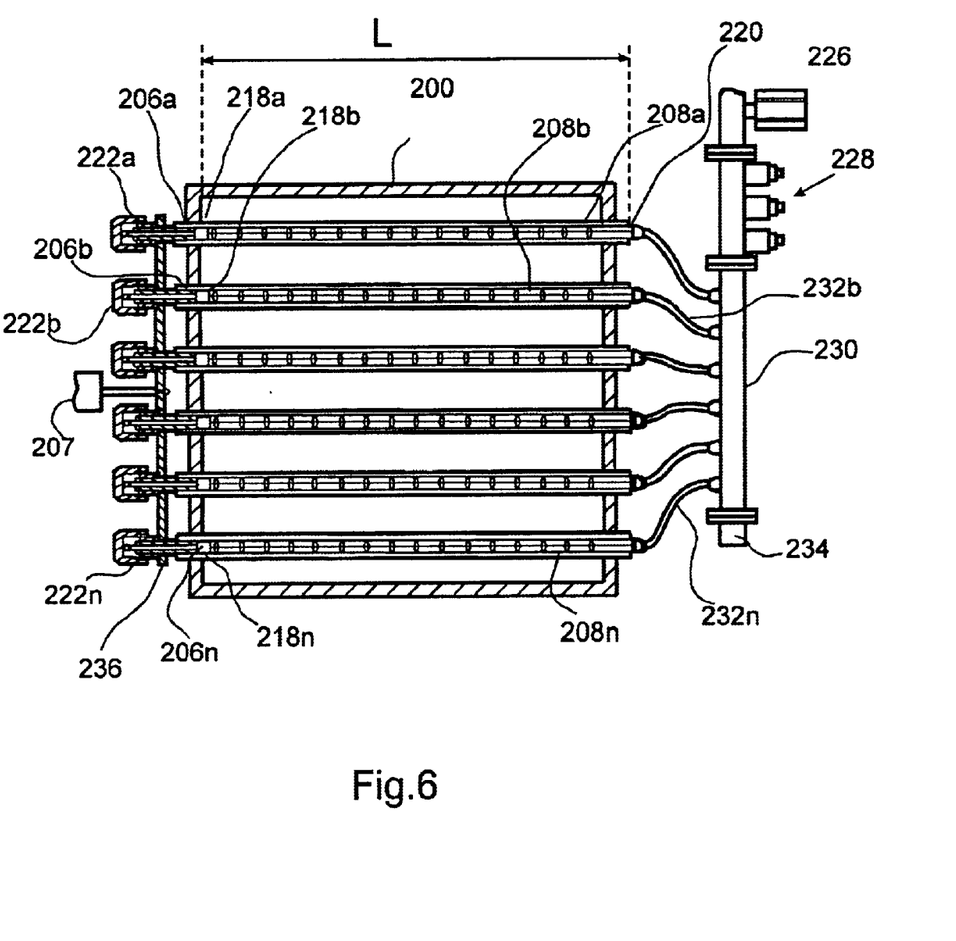
FIG. 6 is a schematic view of a plasma treatment apparatus with microwave antennas in accordance with another embodiment of the invention, in which plasma is excited by microwave energy.
Figure 7:
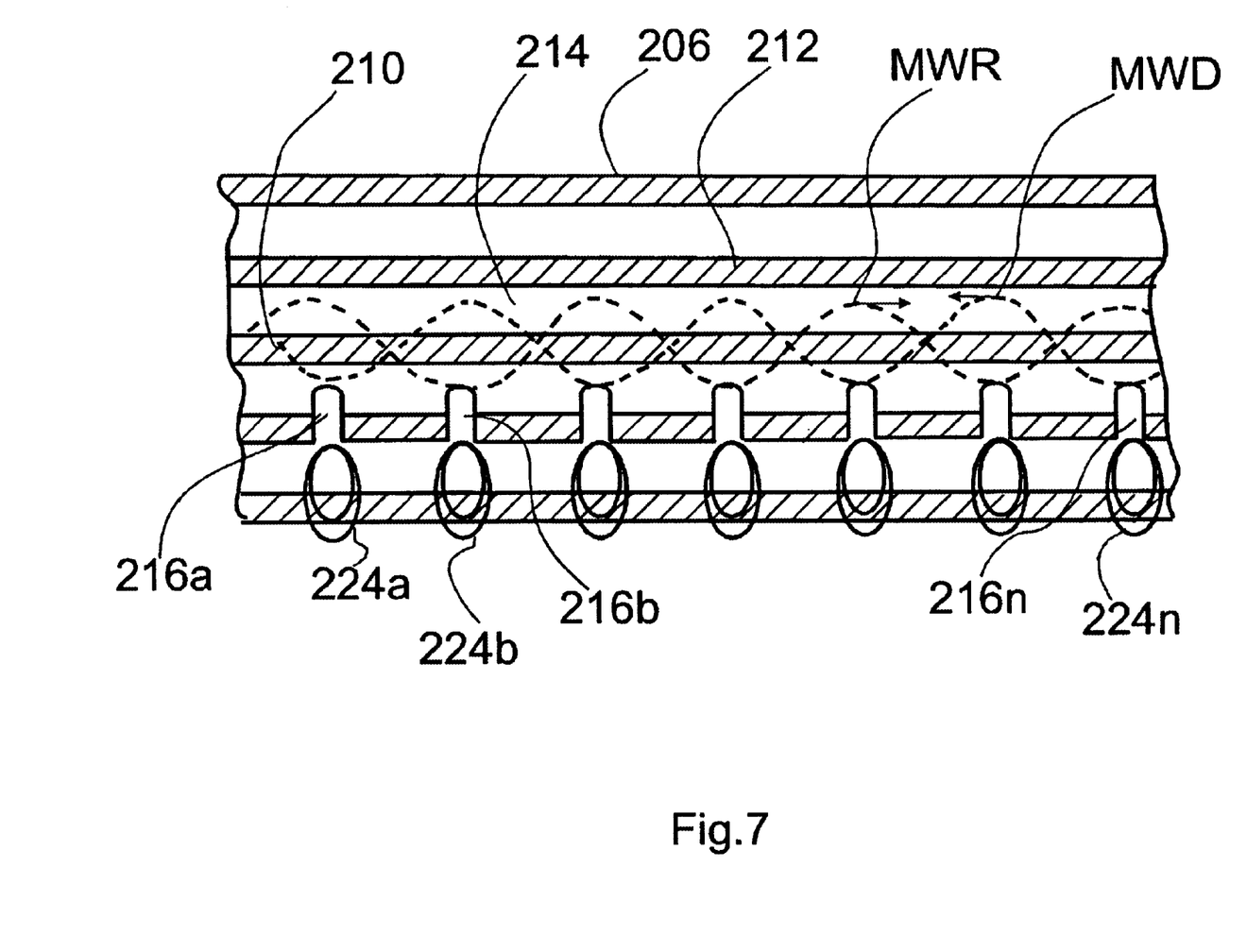
FIG. 7 is a view illustrating formation of a standing wave and directivity of the microwave field generated in the apparatus of FIG. 6.

FIG. 6 is a schematic view of a plasma treatment apparatus with microwave antennas in accordance with another embodiment of the invention, in which plasma is excited by microwave energy. FIG. 7 is a view illustrating formation of a standing wave and directivity of the microwave field generated in the apparatus of FIG. 6.

In principle, the embodiment of the plasma treatment apparatus with excitation of plasma by microwave energy is similar to the apparatus with RF plasma excitation. The apparatus shown in FIGS. 6 and 7 has a sealed housing 200 with a gas evacuation port and a working gas supply port (not shown). Sealingly inserted into the interior of the housing 200 are ceramic or quartz tubes 206a, 206b, . . . 206n, which are similar to tubes 64a, 64b, . . . 64n of the previous embodiment. Description of feedthroughs and other details identical to those of the embodiment shown in FIGS. 1 through 5 will be omitted.

Instead of tubes 80a, 80b, . . . 80n of the previous embodiment, the apparatus of FIGS. 6 and 7 has a group of parallel microwave antennas 208a, 208b, . . . 208n, which are inserted into the outer tubes 206a, 206b, . . . 206n. As shown in FIG. 7, each microwave antenna comprises a coaxial line in the form of rod 210 made of a material with good electrical conductivity, e.g., copper, and an inner tube 212, which is also made from the material of good conductivity, e.g., copper. The rod 210 and the inner tube 212 are electrically isolated from each other by an annular space 214. On the side of the antenna facing a substrate (not shown in FIG. 7), the inner tube 212 has a plurality of slits 216a, 216b, . . . 216n which are arranged in series along the entire length of the antenna and are space from each other with a certain pitch p. The working length L of each antenna 208a, 208b, . . . 208n is adjusted by a respective wave-reflecting plug 218a, 218b, . . . 218n. In FIG. 7, curve MWD designates a direct running wave that propagates from the point of excitation 220 shown FIG. 6, while curve MWR designates a reverse running wave that propagates in the direction opposite to the direction of the direct wave. Coincidence of the phases of the direction and reverse waves will ensure formation of a standing wave (not shown) with an amplitude, which is doubled in comparison to the individual amplitudes of the direct and reverse waves. Phase alignment of the aforementioned waves in all the antennas is carried out by shifting the wave-reflective plugs 218a, 218b, . . . 218n inside the coaxial antennas. The plugs are shifted by means of threaded adjustment mechanisms 222a, 222b, . . . , 222n (FIG. 6). In addition to the double-amplitude mode with a standing wave, the plasma-excitation antennas 208a, 208b, . . . 208n can be adjusted to the normal-amplitude mode when the direct wave MWD and reverse waves MWR are shifted by a quarter of the wavelength with more distributed arrangement of peaks 224a, 224b, . . . 224n of microwave energy irradiated through the slits 216a, 216b, . . . 216n.

It is required that the number of full wavelengths is a multiple of the working length L (FIG. 6) of the antenna and that the number of the slits 216a, 216b, . . . 216n is a multiple of the number of wavelengths.

Thus, it is understood that pitch p between the adjacent slits 216a, 216b, . . . 216n is selected as a ¼ wavelength of the microwave propagating along the respective coaxial line 208a, 208b, . . . 208n of the respective antennas. It is also known that the wavelength that the wavelength of the microwave energy propagating through the coaxial line will be different from the wavelength of the same microwave energy freely propagating through a free space.

In FIG. 6, reference numeral 226 designates a source of microwave energy, e.g., a magnetron which is connected through a matching unit 228 with the antennas 208a, 208b, . . . 208n via a waveguide feeder 230 and respective cables 232a, 232b, . . . 232n on the feeder side. The end of the feeder 230 opposite to the magnetron 226 can be either plugged with an MW energy absorber 234 or the energy can be reflected with a reflecting device (not shown).

The ends of the antennas 208a, 208b, . . . 208n, which project outside the housing 200 on the side of the apparatus opposite to the energy source 226, are linked together by means of a cross beam 236, which can be oscillated for oscillation of the antennas inside the tubes 206a, 206b, . . . 206n in the direction parallel to the direction of the antennas. Oscillations are carried out by means of an oscillator 207 that may work in the same frequency range as the oscillator 94 (FIG. 2).

The apparatus of the embodiment of FIGS. 6 and 7 operates in the same manner as has been described for the RF energy apparatus of FIGS. 1 through 5 with the difference that MW energy is used instead of the RF energy and that cooling of the plasma-excitation elements is carried out by a flow of cooling air (not shown) passed through the space 214 inside the tube 212 (FIG. 7) and outside the tube 212.

Since the housings 20 and 200, as well as the oscillation drives 94 and 207 can be identical in both embodiments, the plasma-excitation units of both devices can be made in the form of replaceable cartridges. More specifically, the inner rods 80a, 80b, . . . 80n can be removed from the ceramic or quartz tubes 64a, 64b, . . . 64n together with all other parts associated with the RF antennas and replaced with MW antennas 208a, 208b, . . . 208n which can be inserted into the same ceramic or quartz tubes 64a, 64b, . . . 64n of FIG. 3.

Figure 8:
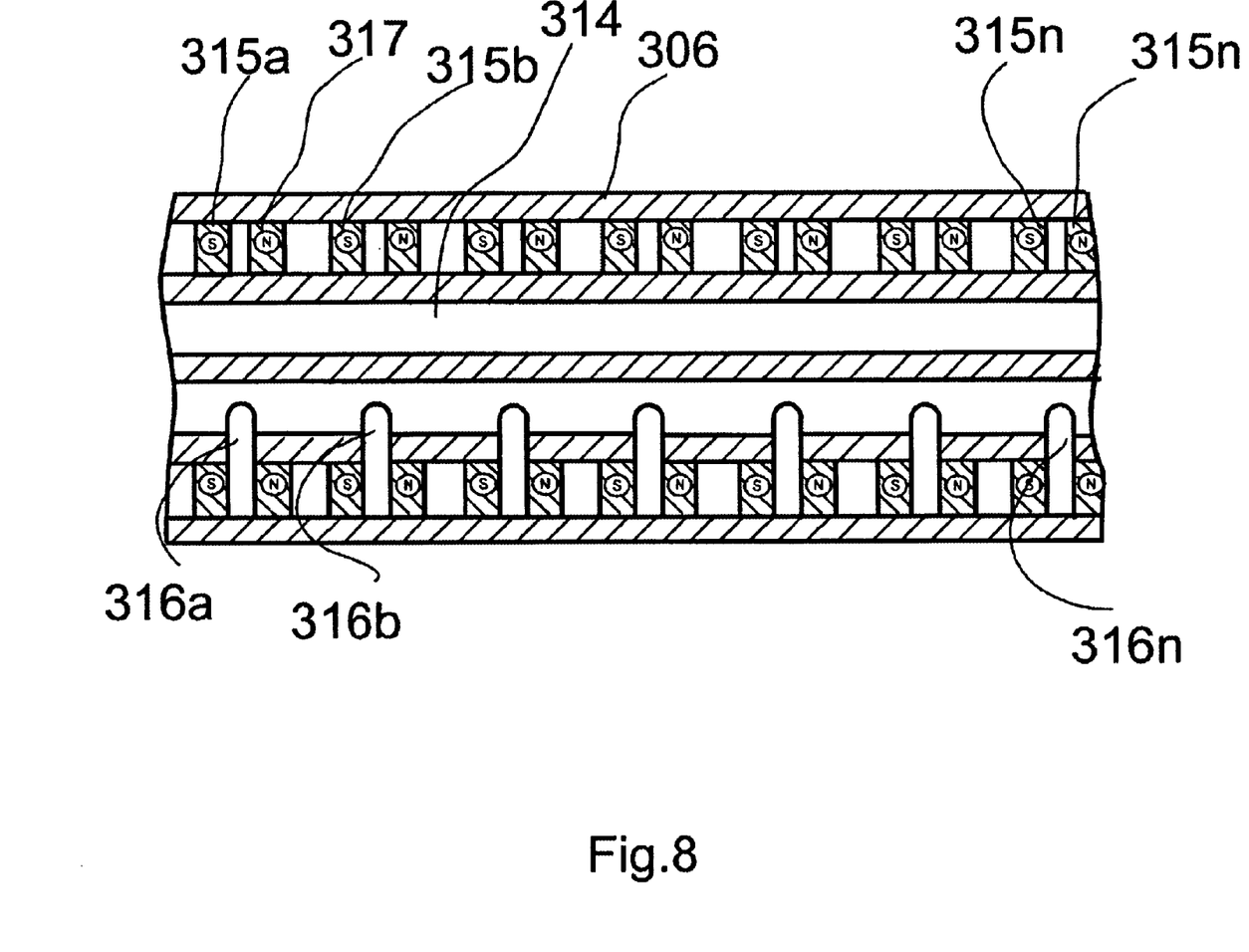
FIG. 8 is a view similar to FIG. 7 illustrating an embodiment of the invention with electron-cyclotron resonance magnets incorporated into the inner tube of the MW antenna for increase in the density of the plasma.

FIG. 8 is a view similar to FIG. 7 illustrating an embodiment of the invention with electron-cyclotron resonance magnets incorporated into the inner tube of the MW antenna for increase in the density of the plasma. In FIG. 8, parts of the MW antenna similar to those shown and described with reference to FIG. 7 will be designated by the same reference numerals with the addition of 100. Thus, the antenna assembly has an outer tube 306 that contains an inner tube 312 arranged inside the outer tube 306 with a space 314. The MW antenna shown in FIG. 8 is provided with means for excitation of electron-cyclotron resonance conditions in the sealed housing (not shown in FIG. 8) for intensification of density of plasma generated by the MW antenna. The aforementioned means for generating electron-cyclotron resonance conditions comprise a plurality of annular magnets 315a, 317a, 315b, 317b, . . . 315n, 317n, which are rigidly attached to the inner tube 312 for joint movement therewith. Therefore, the magnets should freely move inside the outer tube 306. These magnets are concentrically arranged in the space 314 and are arranged in pairs on both sides of each of the slits 316a, 316b, . . . 316n, respectively.

In operation, in addition to functions of the MW antenna shown and described with reference to FIG. 7, the antenna of FIG. 8 also generates a magnetic field with the use of annular magnets 315a, 317a, . . . 315n, 317n. It is understood that magnetic force lines of this field outside the outer tuber will a pattern similar to a plurality of torroids (not shown). It is also understood that intensity of the magnetic field can be adjusted so that in a certain part of the space occupied by the aforementioned torroids the magnetic field will correspond to electron-cyclotron resonance conditions for specific MW frequency. For example for frequency of 2.45 GHz the magnetic field will be equal to 875 Gauss. In the areas where such field is maintained, concentration of free electrons will grow due to electron-cyclotron resonance, and as a result, density of the plasma will increase.

It is understood that with oscillation of the MW antenna with magnets, the magnetic field will also move and participate in improving uniformity of plasma.

Thus, it has been shown that the invention provides an apparatus and method for uniform plasma treatment of surfaces of objects in a vacuum working chamber due to oscillations of the plasma-excitation electromagnetic field with respect to the treated surface. In the MW embodiment, uniformity of plasma treatment is achieved by combining oscillatory movements of the plasma-excitation electromagnetic field with a running wave in a microwave frequency range. The dielectric waveguide for microwaves is simultaneously used for the supply of cooling air. The apparatus is simple in construction and inexpensive to manufacture.

Although the invention has been shown and described with reference to specific embodiments, it is understood that these embodiments should not be construed as limiting the areas of application of the invention and that any changes and modifications are possible, provided these changes and modifications do not depart from the scope of the attached patent claims. For example, plasma-excitation antennas may work on frequencies different from those indicated in the description. The antennas themselves can be arranged in different pattern, e.g., in a spiral form rather than serpentine. In that case, the construction of the ceramic shell should ensure insertion of the inner part, e.g., by means of a split-type construction consisting of an upper portion and an inner portion. The antennas can be arranged even outside of the housing. In that case the housing should not block propagation of the energy to the interior of the housing that may contain the substrate. The oscillatory motions may have different trajectories by combining linear motions with rotary or planetary motions. The antennas may have a spatial arrangement. The antennas may be combined into groups that perform different oscillator motions and/or oscillatory frequencies. In the embodiment with electron-cyclotron resonance system, the magnets can be secured to the outer tube, while the inner tube will move with respect to the outer tube and magnets.

I claim:

1. A plasma treatment apparatus for treating the surface of an object comprising:

a sealed housing having a gas supply port for supply of a working gas into said sealed housing and an evacuation port for connection of said sealed housing to a vacuum system;

at least one MW antenna for propagation of microwave energy along said antenna in the form of waves having wavelengths and exciting an MW plasma in said sealed housing;

a source of MW energy for connection to said at least one MW antenna; and an oscillation drive means for imparting to said at least one MW antenna oscillatory motions during treatment of the surface of said object with said plasma, said at least one MW antenna comprising an outer tube made from a non-conductive material, which sealingly passes through said housing and has ends projecting from said housing, an inner tube located in said outer tube and forming a space therewith, and a rod made from a conductive material, said rod passing through said inner tube and being connected thereto, said rod and said outer tube being connected to said oscillation drive means, said MW antenna having a working length, said inner tube having a plurality of through slits on the side of said inner tube that faces said object, the number of said wavelengths being a first multiple of the working length of said at least one antenna, and the number of said slits being a second multiple of the number of said wavelengths, said plasma treatment apparatus further comprising means for generating electron-cyclotron resonance conditions in said sealed housing for intensification of density of plasma generated by said MW antenna.

2. The apparatus of claim 1, wherein said means for generating electron-cyclotron resonance conditions comprise a plurality of annular magnets concentrically arranged in said space, said annular magnets being arranged in pairs on both sides of each of said slits.

3. A plasma treatment apparatus for treating the surface of an object comprising:

a sealed housing having a gas supply port for supply of a working gas into said sealed housing and an evacuation port for connection of said sealed housing to a vacuum system;

at least one plasma-excitation means for excitation of plasma in said sealed housing;

a source of plasma-excitation energy for connection to said plasma-excitation means; and an oscillation drive means for imparting to said at least one plasma-excitation means oscillation oscillatory motions during treatment of the surface of said object with said plasma;

said at least one plasma-excitation means comprising at least one RF antenna for excitation of an RF plasma;

said at least one RF antenna comprising an outer tube made from a non-conductive material, which sealingly passes through said housing and has ends projecting from said housing, and an inner tube made from a conductive material, said inner tube passing through said outer tube and being connected to said oscillation drive means.

4. The apparatus of claim 3, further comprising an object holder for supporting said object during said plasma treatment in contact with said plasma.

5. A plasma treatment apparatus for treating the surface of an object comprising:

a sealed housing having a gas supply port for supply of a working gas into said sealed housing and an evacuation port for connection of said sealed housing to a vacuum system;

at least one plasma-excitation means for excitation of plasma in said sealed housing;

a source of plasma-excitation energy for connection to said plasma-excitation means; and an oscillation drive means for imparting to said at least one plasma-excitation means oscillatory motions during treatment of the surface of said object with said plasma;

said at least one plasma-excitation means comprising at least one MW antenna for propagation of microwave energy along said antenna in the form of waves having wavelengths and exciting an MW plasma in said sealed housing;

said at least one MW antenna comprising an outer tube made from a non-conductive material, which sealingly passes through said housing and has ends projecting from said housing, an inner tube made from a conductive material and inserted into said outer tube with a space therebetween, and a rod made from a conductive material, said rod passing through said inner tube and being rigidly connected thereto, said rod and said inner tube being rigidly connected to said oscillation drive means, said MW antenna having a working length.

6. The apparatus of claim 5, wherein said inner tube has a plurality of through slits on the side of said outer tube that faces said object, the number of said wavelengths being a first multiple of the working length of said at least one antenna, and the number of said slits being a second multiple of the number of said wavelengths.

7. The apparatus of claim 6, wherein said at least one antenna has means for adjusting said working length in order to provide said first multiple and said second multiple.

8. A plasma treatment apparatus for treating the surface of a semiconductor substrate comprising:

a sealed housing having a gas supply port for supply of a working gas into said sealed housing and an evacuation port for connection of said sealed housing to a vacuum system; a plurality of plasma-excitation means located inside said sealed housing for excitation of plasma in said sealed housing; a source of plasma-excitation energy connected to said plasma excitation means; a substrate supporting means for supporting said substrate in contact with said plasma during said plasma treatment; and an oscillation drive means for imparting to said plurality of plasma excitation means oscillatory motions during said plasma treatment;

said plurality of plasma-excitation means comprise RF antennas for excitation of an RF plasma;

each of said RF antennas comprising an outer tube made from a non-conductive material, which sealingly passes through said housing and has ends projecting from raid housing, and an inner tube made from a conductive material, said inner tube passing through said outer tube and being rigidly interconnected outside said housing by an interconnecting means which is connected to said oscillation drive means.

9. A plasma treatment apparatus for treating the surface of a semiconductor substrate comprising:

a sealed housing having a gas supply port for supply of a working gas into said sealed housing and an evacuation port for connection of said sealed housing to a vacuum system; a plurality of plasma-excitation means located inside said sealed housing for excitation of plasma in said sealed housing; a source of plasma-excitation energy connected to said plasma excitation means; a substrate supporting means for supporting said substrate in contact with said plasma during said plasma treatment; and an oscillation drive means for imparting to said plurality of plasma excitation means oscillatory motions during said plasma treatment;

said plurality of plasma-excitation means comprising MW antennas for propagation of microwave energy along said MW antennas in the form of waves having wavelengths and exciting an MW plasma in said sealed housing;

each of said MW antennas comprising an outer tube made from a non-conductive material, which sealingly passes through said sealed housing and has ends projecting from said sealed housing, an inner tube made from a conducive material which located inside said outer tube and forms a space therewith, and a rod made from a conductive material, said rod passing through said inner tube and being rigidly connected to said inner tube, said rod of each of said antennas being rigidly connected to an interconnecting means which is connected to said oscillation drive means, each of said MW antenna having a working length.

10. The apparatus of claim 9, wherein said inner tube has a plurality of through slits on the side of said inner tube that faces said substrate, the number of said wavelengths being a first multiple of the working length of said at least one antenna, and the number of said slits being a second multiple of the number of said wavelengths.

11. The apparatus of claim 10, wherein each said MW antenna has means for adjusting said working length in order to provide said first multiple and said second multiple.

12. The apparatus of claim 9, wherein each said MW antenna has means for adjusting said working length.

* * * * *